US008466514B2

(12) United States Patent
Hsieh

(10) Patent No.: US 8,466,514 B2
(45) Date of Patent: Jun. 18, 2013

(54) SEMICONDUCTOR POWER DEVICE INTEGRATED WITH IMPROVED GATE SOURCE ESD CLAMP DIODES

(75) Inventor: Fu-Yuan Hsieh, New Taipei (TW)

(73) Assignee: Force Mos Technology Co., Ltd. (TW)

( * ) Notice: Subject to any disclaimer, the term of this patent is extended or adjusted under 35 U.S.C. 154(b) by 0 days.

(21) Appl. No.: 13/274,642

(22) Filed: Oct. 17, 2011

(65) Prior Publication Data
US 2013/0092976 A1  Apr. 18, 2013

(51) Int. Cl.
*H01L 29/66* (2006.01)
(52) U.S. Cl.
USPC ............. 257/330; 257/E27.016; 257/E29.257
(58) Field of Classification Search
CPC .............. H01L 29/7813; H01L 29/4236; H01L 29/66734
USPC ........... 257/328, 330, 334, E27.016, E29.257
See application file for complete search history.

(56) References Cited

U.S. PATENT DOCUMENTS

2008/0290367 A1* 11/2008 Su et al. .................... 257/173
2010/0314681 A1* 12/2010 Hsieh ......................... 257/328

* cited by examiner

*Primary Examiner* — Nikolay Yushin
(74) *Attorney, Agent, or Firm* — Bacon & Thomas, PLLC

(57) ABSTRACT

A trench semiconductor power device integrated with four types of ESD clamp diodes for optimization of total perimeter of the ESD clamp diodes, wherein the ESD clamp diodes comprise multiple back to back Zener diodes with alternating doped regions of a first conductivity type next to a second conductivity type, wherein each of the doped regions has a closed ring structure.

12 Claims, 11 Drawing Sheets

SEMICONDUCTOR POWER DEVICE INTEGRATED WITH IMPROVED GATE SOURCE ESD CLAMP DIODES

FIELD OF THE INVENTION

This invention relates generally to the cell structure, device configuration and layout of semiconductor power devices. More particularly, this invention relates to an improved cell structure and device configuration to manufacture a trench semiconductor power device integrated with improved Gate-Source Electrostatic Discharge (ESD hereinafter) clamp diodes having improved ESD layouts and device structures.

BACKGROUND OF THE INVENTION

Conventional layouts and device structures for manufacturing a trench semiconductor power device integrated with Gate-Source ESD clamp diodes for providing an ESD protection still have a limitation. A prior art U.S. Pat. Pub. No. 2008/0290367 discloses several kinds of structures that comprise a trench semiconductor power device integrated with ESD clamp diodes. FIG. 1A is a top view of a MOSFET (Metal Oxide Semiconductor Field Effect Transistor) device 100 which includes a gate metal pad 102 connected to a gate metal runner 103 disposed on the peripheral edges of the device 100 and a source metal pad 101. There is a metal gap 104 opened between the source metal pad 101 and the gate metal pad 102 and the gate metal runner 103. Gate-Source ESD clamp diodes 105 are connected between the gate metal runner 103 and the source metal pad 101. FIG. 1B is a top view of another MOSFET device 110 that includes a gate metal pad 112 connected to gate metal runners 113 and a source metal pad 111 with a metal gap 114 disposed between them. Unlike the MOSFET device 100 in FIG. 1A, the MOSFET 110 in FIG. 1B further comprises poly-silicon resistors 115 together with Gate-Source ESD clamp diodes 116 which are connected between the gate metal runner 113 and the source metal pad 111. And furthermore, in FIG. 1B, there is another kind of Gate-Source ESD clamp diode 117 which is connected between the gate metal pad 112 and the source metal pad 111. All the Gate-Source ESD clamp diodes in FIG. 1A and FIG. 1B comprise multiple back to back Zener diodes with alternating n+ doped regions next to p+ doped regions, wherein the alternating n+ doped regions and p+ doped regions have a stripe structure which would have a leakage path along an edge of the Gate-Source ESD clamp diodes because the dry poly-silicon etch step in the manufacturing process would damage the edge of the Gate-Source ESD clamp diodes.

FIG. 1C is a cross-section view of a MOSFET device integrated with Gate-Source ESD clamp diodes disclosed in the prior art discussed above, which shows that an Gate-Source ESD clamp diode is connected between a gate metal pad 121 and a source metal pad 122, wherein the gate metal pad 121 is further connected to a first type trenched gate 125 encompassed in a body region 123 for gate connection, and the source metal pad 122 is further connected to source regions 124 flanking second type trenched gates 126 in the body regions 123. The body regions 123 are formed only underneath the edges of the Gate-Source ESD clamp diode, which would cause early breakdown occurrence at corners of the body regions 123.

Therefore, there are only two types of Gate-Source ESD clamp diodes in the prior art: a first type is formed between the gate metal pad and the source metal pad, and a second type is formed between the source metal pad and the gate metal runner. Especially for small-size devices, there is not much space budget for the Gate-Source ESD clamp diodes due to the size limitation of dies, which requires increasing the total perimeter of the Gate-Source ESD clamp diodes for ESD capability enhancement.

Therefore, there is still a need in the art of the semiconductor power device integrated with Gate-Source ESD clamp diodes, to provide a novel cell structure, device configuration and layout that would further increase total perimeter of the Gate-Source ESD clamp diodes for ESD capability enhancement without sacrificing other performances and improve other characteristics of the semiconductor power device.

SUMMARY OF THE INVENTION

It is therefore an aspect of the present invention to provide a semiconductor power device so that the total perimeter of the Gate-Source ESD clamp diodes is increased for ESD capability enhancement without sacrificing other performances of the semiconductor power device. According to the present invention, there is provided a semiconductor power device integrated with Gate-Source ESD clamp diodes formed on a semiconductor silicon layer, comprising a plurality of transistor cells in an active area, and multiple back to back Zener diodes with alternating doped regions of a first conductivity type next to a second conductivity type in the Gate-Source ESD clamp diodes. The trench semiconductor power device further comprises: a plurality of first type trenched gates surrounded by source regions of the first conductivity type encompassed in body regions of the second conductivity type; a plurality of trenched source-body contacts opened through the source regions and extending into the body regions, filled with a contact metal plug therein and connected to a front metal serving as a source metal pad. The Gate-Source ESD clamp diodes further comprises: a gate metal pad connected to at least one gate metal runner surrounding a peripheral region of the semiconductor power device; the source metal pad connected to at least one source metal runner disposed between the gate metal pad and the gate metal runner, and separated from the gate metal pad and the gate metal runner my a metal gap, wherein the source metal runner does not have the first type trenched gates underneath; a first type Gate-Source ESD clamp diode connected between the gate metal pad and the source metal pad; a second type Gate-Source ESD clamp diode connected between the gate metal pad and the source metal runner; a third type Gate-Source ESD clamp diode connected between the source metal pad and the gate metal runner; a fourth type Gate-Source ESD clamp diode connected between the source metal runner and the gate metal runner. The semiconductor power device can be formed as a trench MOSFET, and the semiconductor silicon layer comprises an epitaxial layer of the first conductivity type onto a substrate of the first conductivity type. The semiconductor power device can also be formed as a trench IGBT (Insulated Gate Bipolar Transistor), and the semiconductor silicon layer comprises a first epitaxial layer of the first conductivity type onto a substrate of the second conductivity type, and a second epitaxial layer of the first conductivity type onto the first epitaxial layer, wherein the first epitaxial layer has a higher doping concentration than the second epitaxial layer.

It is therefore another aspect of the present invention that the gate metal pad is having square or circular shape in some preferred embodiment, and is having rectangular shape in another preferred embodiment to further enlarge the total perimeter of the Gate-Source ESD clamp diodes for ESD capability enhancement.

It is therefore another aspect of the present invention to provide a poly-silicon resistor formed on the top surface of the semiconductor silicon layer to connect a gate contact metal to the gate metal pad, wherein the gate contact metal is also connected to a fourth type trenched gate underneath for gate connection.

It is therefore another aspect of the present invention that each of the alternating doped regions of the Gate-Source ESD clamp diodes has closed ring structure that would not touch edges of the Gate-Source ESD clamp diodes.

It is therefore another aspect of the present invention that the body regions are formed underneath the Gate-Source ESD clamp diodes, and are further extended between every two adjacent of second type trenched gates functioning as etch-buffer trenched gate, and the etch-buffer trenched gates are penetrating through the body regions and disposed right below trenched ESD contacts in the Gate-Source ESD clamp diodes, wherein the etch-buffer trenched gate have trench width greater than the trenched ESD contacts for prevention of gate-body shortage.

Some preferred embodiments include one or more detail features as followed: the Gate-Source ESD clamp diodes are separately connected to the gate metal pad, the gate metal runner, the source metal pad and the source metal runner via trenched ESD contacts filled with the contact metal plug; each of the alternating doped regions of the Gate-Source ESD clamp diodes has a closed ring structure; the semiconductor power device further comprises at least one body-dopant region of the second conductivity type with floating voltage in a termination area, wherein the body-dopant region is formed simultaneously as the body regions; the semiconductor power device further comprises a source-dopant region of the first conductivity type formed near an edge of the semiconductor power device, wherein the source-dopant region is formed simultaneously as the source regions; the semiconductor power device further comprises a trenched drain contact filled with the contact metal plug and penetrating through the source-dopant region, and further extended into the semiconductor silicon layer; the semiconductor power device further comprises an ohmic contact doped region of the second conductivity type surrounding at least bottom of the trenched drain contact underneath the source-dopant region, and the ohmic contact doped region has a higher doping concentration than the body regions; there is no front metal coveting a top surface of the contact metal plug in the trenched drain contact; the semiconductor power device further comprises multiple third type trenched gates having floating voltage in a termination area; the contact metal plug is a tungsten layer padded with a barrier metal layer of Ti/TiN or Co/TiN; the front metal is Al alloys overlying a resistance-reduction layer of Ti or Ti/TiN.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

In the following Detailed Description, reference is made to the accompanying drawings, which forms a part hereof, and in which is shown by way of illustration specific embodiments in which the invention may be practiced. In this regard, directional terminology, such as "top", "bottom", "front", "back", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be make without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1A:
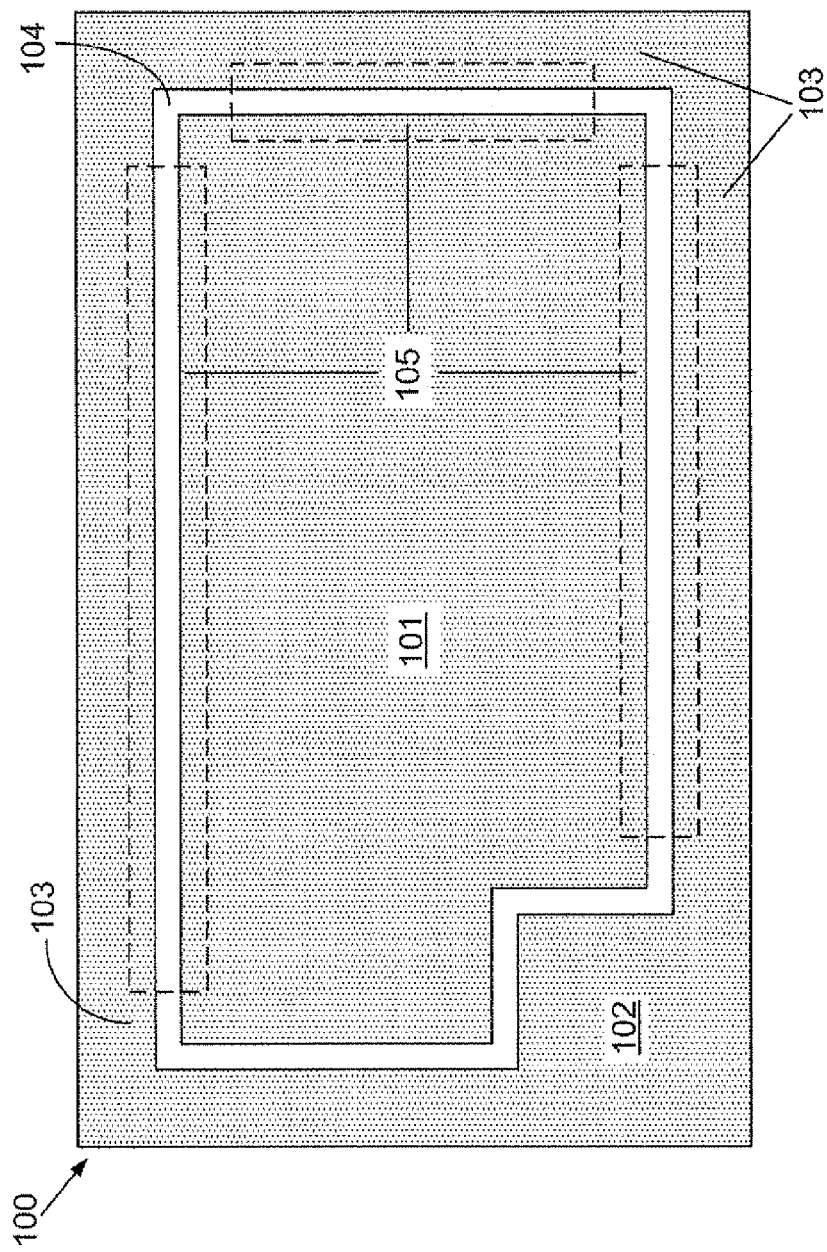
FIG. 1A is a top view of a prior art for a MOSFET device integrated with Gate-Source ESD clamp diodes.
Figure 1B:
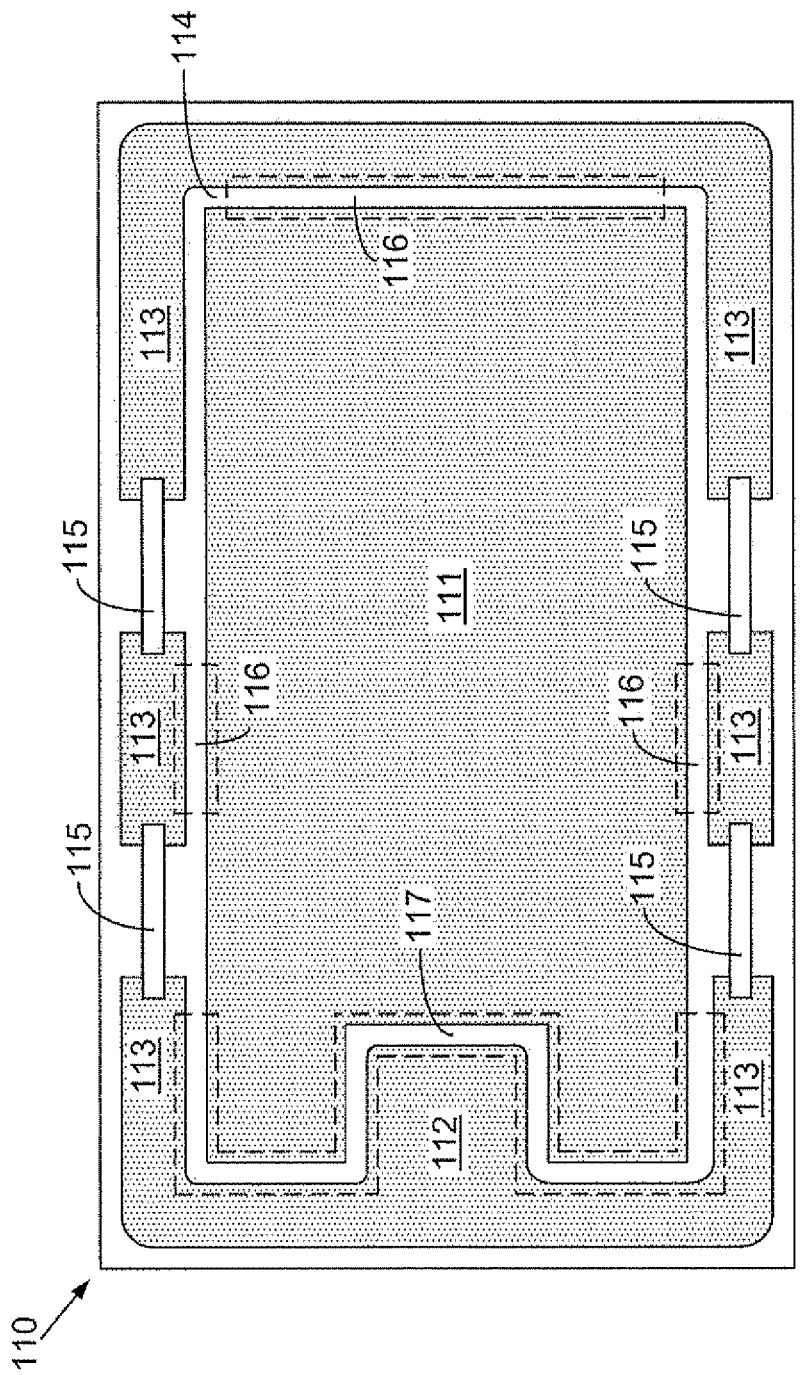
FIG. 1B is a top view of the prior art for another MOSFET device integrated with Gate-Source ESD clamp diodes.
Figure 1C:
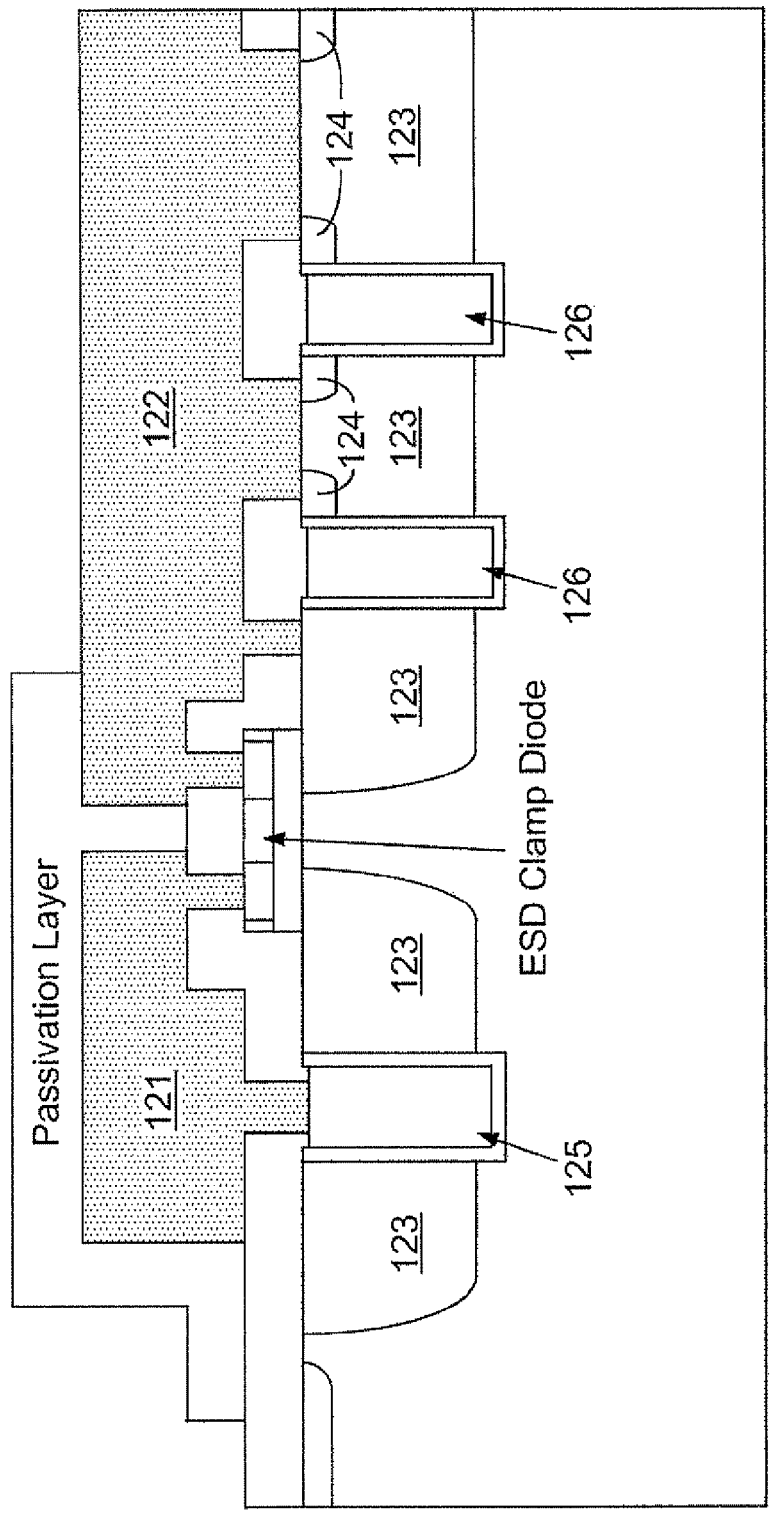
FIG. 1C is a cross-section view of a MOSFET device integrated with Gate-Source ESD clamp diodes according to the prior art.
Figure 2A:
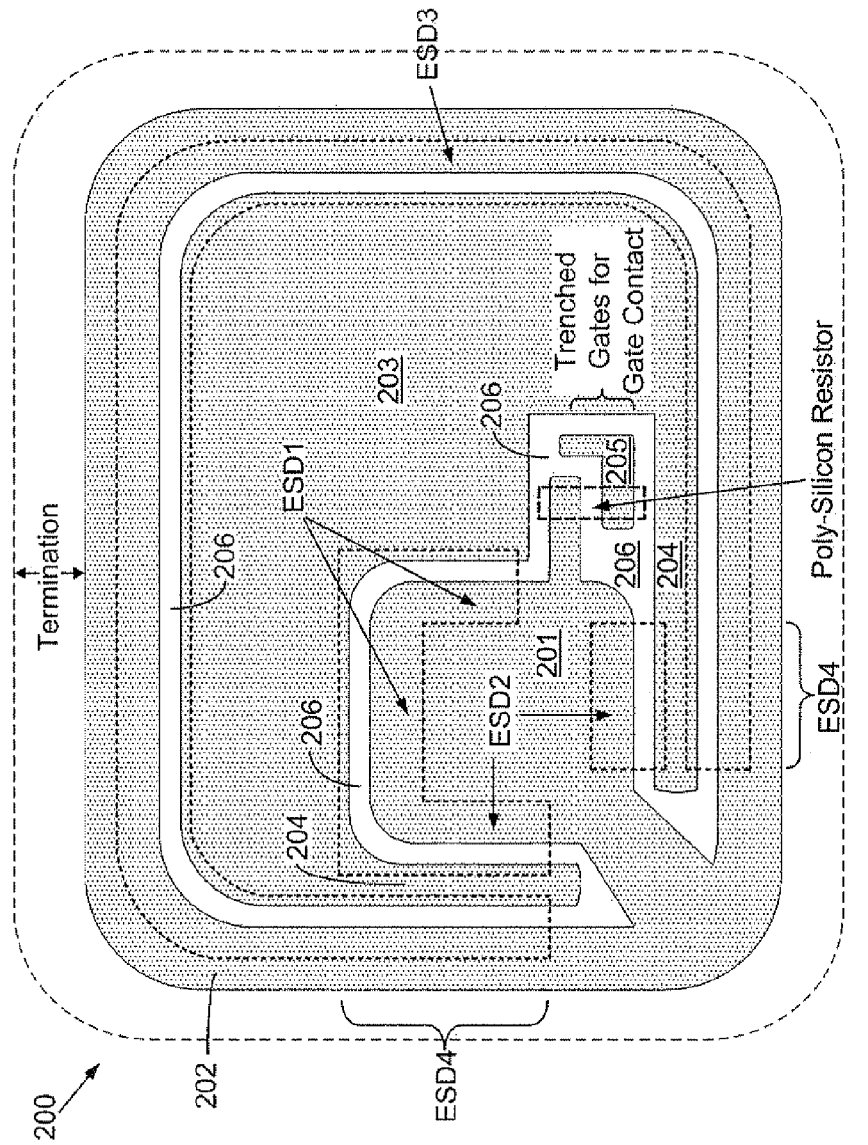
FIG. 2A is a top view of a preferred embodiment for a trench semiconductor power device with square gate metal pad and four types of Gate-Source ESD clamp diodes according to the present invention.

Please refer to FIG. 2A for a preferred embodiment of this invention, wherein a trench semiconductor power device 200 is shown integrated with Gate-Source ESD clamp diodes for ESD prevention. The trench semiconductor power device 200 includes a gate metal pad 201 for gate wire bonding with a gate metal runner 202 surrounding a peripheral region of the trench semiconductor power device 200 and a source metal pad 203 for source wire bonding with a source metal runner 204 surrounding a peripheral region of the gate metal pad 201, wherein the source metal pad 203 with the source metal runner 204, the gate metal pad 201 with the gate metal runner 202, and a gate contact metal 205 are composed of Al alloys as a front metal overlying a resistance-reduction layer of Ti or Ti/TiN, and are separated by a metal gap 206. The source metal pad 203 is connected to a plurality of source regions and body regions surrounding a plurality of first type trenched gates underneath an active area while the source metal runner does not have the first type trenched gates underneath. A gate contact metal 205 is connected to fourth type trenched gates underneath for gate connection, and is also connected to the gate metal pad 201 through a poly-silicon resistor. The gate metal pad 201 having a square or circular shape is for gate wire bonding, and the source metal pad 203 is for source wire bonding. The gate metal runner 202 and the source metal runner 204 are used for the Gate-Source ESD clamp diodes only. There are four types of Gate-Source ESD clamp diodes for providing an ESD protection between a source electrode and a gate electrode of the trench semiconductor power device 200: a first type Gate-Source ESD clamp diode (ESD1, as illustrated) connected between the gate metal pad 201 and the source metal pad 203; a second type Gate-Source ESD clamp diode (ESD2, as illustrated) connected between the gate metal pad 201 and the source metal runner 204; a third type Gate-Source ESD clamp diode (ESD3, as illustrated) connected between the gate metal runner 202 and the source metal pad 203; and a fourth type Gate-Source ESD clamp diode (ESD4, as illustrated) connected between the gate metal runner 202 and the source metal runner 204. Therefore, the improved layout and device structure according to the present invention comprises two more types of Gate-Source ESD clamp diodes comparing to the prior art that has only two types of Gate-Source ESD clamp diodes, which increases the total perimeter of the Gate-Source ESD clamp diodes to enhance ESD capability especially for small devices.

Figure 2B:
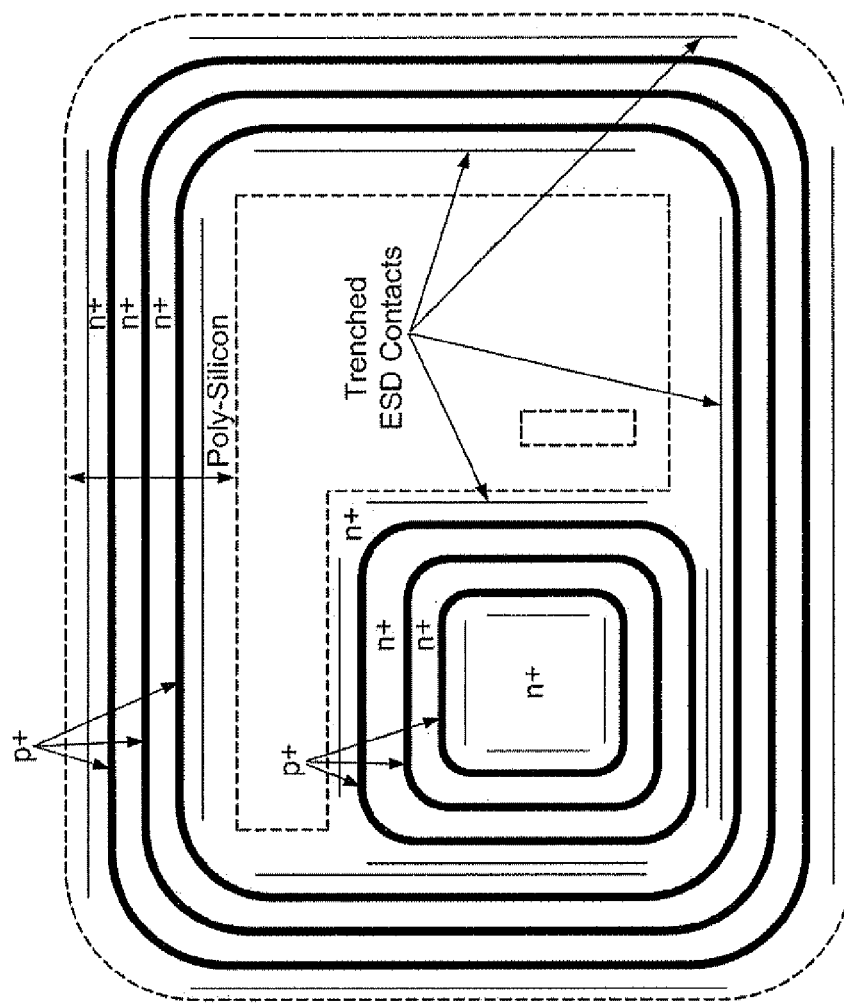
FIG. 2B is a top view of a preferred embodiment for showing the doped regions of the Gate-Source ESD clamp diodes according to the present invention.

FIG. 2B is a top view of device configuration of FIG. 2A under the gate metal pad 201 and the gate metal runner 202. The Gate-Source ESD clamp diodes comprise multiple back to back Zener diodes with alternating n+ doped regions next to p+ doped regions formed under the gate metal pad 201 and the gate metal runner 202 of the trench semiconductor power device 200 as shown in FIG. 2A, wherein the multiple doped regions have multiple n+ and p+ closed rings on a poly-silicon layer, that would not touch edges of the Gate-Source ESD clamp diodes, therefore, the improved layout and device structure according to the present invention would not have the leakage path that exists in the prior art. The Gate-Source ESD clamp diodes further comprise trenched ESD contacts filled with a contact metal plug and extending into the n+ doped regions on two sides of each of the Gate-Source ESD clamp diodes for an N-channel trench semiconductor power device.

Figure 3A:
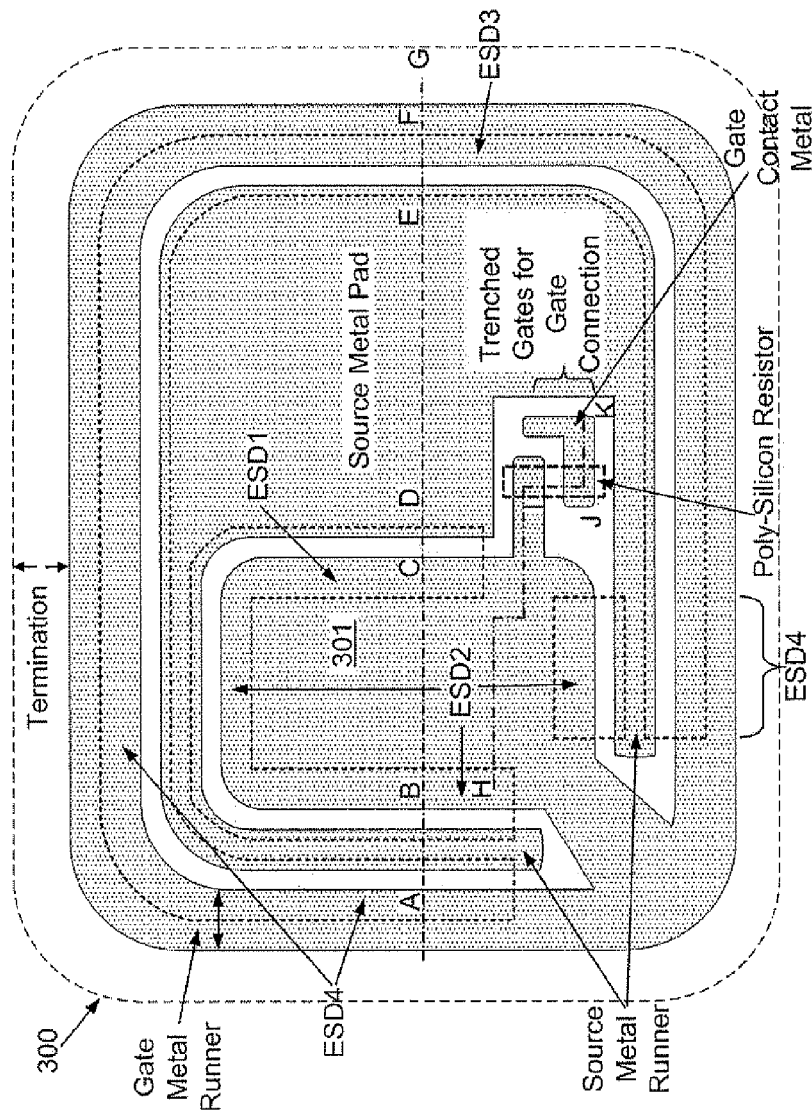
FIG. 3A is a top view of another preferred embodiment for a trench semiconductor power device with rectangular gate metal pad and four types of Gate-Source ESD clamp diodes according to the present invention.

FIG. 3A is a top view of another preferred embodiment for a trench semiconductor power device 300 with four types of Gate-Source ESD clamp diodes according to the present invention. The structure of FIG. 3A is similar to the structure of FIG. 2A except that, in FIG. 3A, the gate metal pad 301 has a rectangular shape instead of the square or circular shape in FIG. 2A. Therefore, the total perimeter of the Gate-Source ESD clamp diodes in FIG. 3A is larger than the total perimeter of the Gate-Source clamp diodes in FIG. 2A, which means that the trench semiconductor power device 300 in FIG. 3A would have better ESD capability than the trench semiconductor power device 200 in FIG. 2A.

Figure 3B:
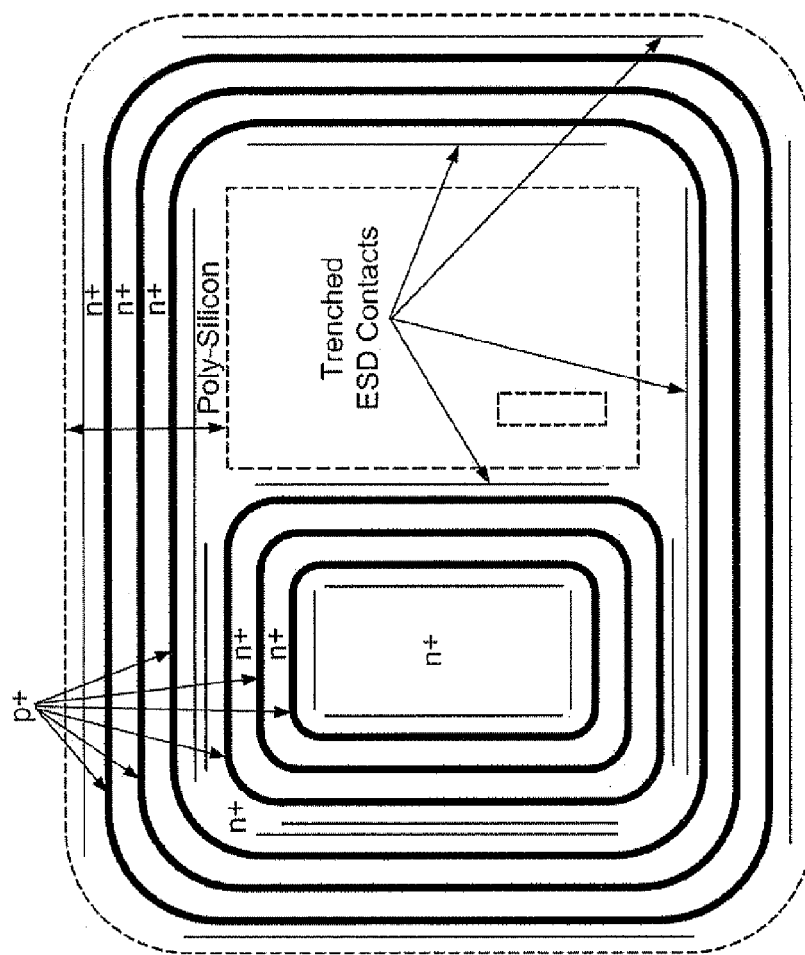
FIG. 3B is a top view of another preferred embodiment for showing the doped regions of the Gate-Source ESD clamp diodes according to the present invention.

FIG. 3B is a top view showing the doped regions and the contact regions of the Gate-Source ESD clamp diodes underneath the gate metal pad 301 and the gate metal runner shown in FIG. 3A. The doped regions in FIG. 3B is similar to the doped regions in FIG. 2B except that, in FIG. 3B, the doped regions of the first type Gate-Source ESD clamp diode (ESD1, as illustrated in FIG. 3A) and the second type Gate-Source ESD clamp diode (ESD2, as illustrated in FIG. 3A) have a closed rectangular ring shape instead of a closed square ring shape in FIG. 2B.

Figure 3C:
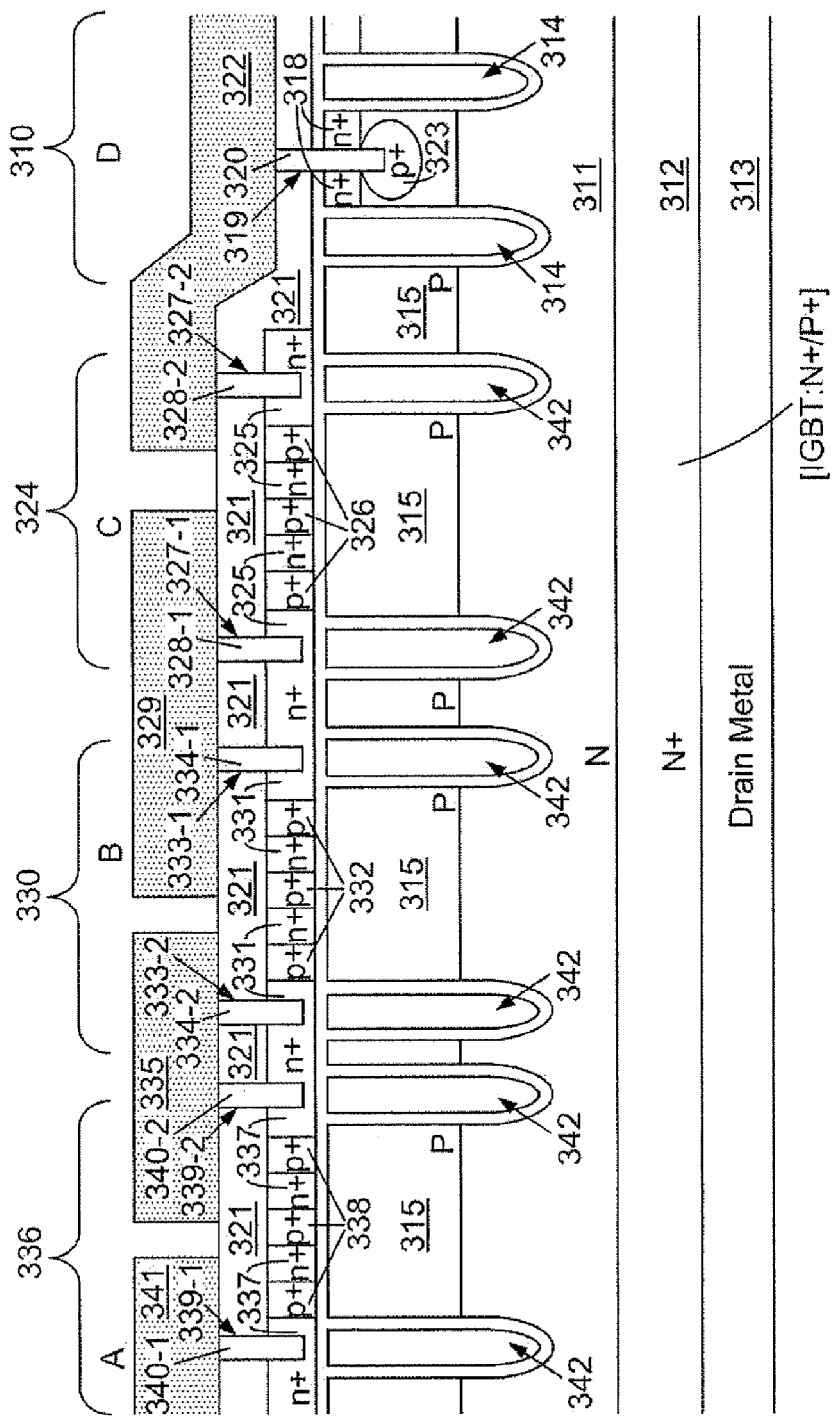
FIG. 3C is a cross-section view showing a preferred A-B-C-D cross section of FIG. 3A.

Please refer to FIG. 3C for a preferred A-B-C-D cross-section view of FIG. 3A, wherein an N-channel trench semiconductor power device is shown comprising an N-channel trench MOSFET 310 integrated with Gate-Source ESD clamp diodes between a gate electrode and a source electrode for ESD prevention. The N-channel trench MOSFET 310 is formed in a semiconductor silicon layer which can be implemented by comprising an N epitaxial layer 311 above a heavily doped N+ substrate 312 coated with a back metal of Ti/Ni/Ag on a bottom side as a drain metal 313. In the trench MOSFET 310, a plurality of first type trenched gates 314 are formed spaced apart by P body regions 315 and extending into the N epitaxial layer 311. N+ source regions 318 are encompassed in the P body regions 315 between a pair of the first type trenched gates 314. A trenched source-body contact 319 filled with a contact metal plug 320, for example, a tungsten layer padded by a barrier metal layer of Ti/TiN or Co/TiN or Ta/TiN, is implemented through a contact interlayer 321, the n+ source regions 318 flanking the first type trenched gates 314 and extending into the P body regions 315 between a pair of the first type trenched gates 314 to connect the P body regions 315 and the n+ source regions 318 to a source metal pad 322 onto the contact interlayer 321. A p+ ohmic contact doped region 323 having a higher doping concentration than the P body regions 315 is formed surrounding at least bottom of the trenched source-body contact 319 to reduce the contact resistance between the P body regions 315 and the contact metal plug 320 in the trenched source-body contact 319. A first type Gate-Source ESD clamp diode (ESD1, as illustrated in FIG. 3A) 324 for providing an ESD protection comprises multiple back to back Zener diodes with alternating n+ doped regions 325 next to p+ doped regions 326, and further comprises trenched ESD contacts (327-1 and 327-2) filled with the contact metal plugs (328-1 and 328-2, which are the same as the contact metal plug 320) extending into the n+ regions 325 on two sides (an anode side and a cathode side) of the first type Gate-Source ESD clamp diode 324. The trenched ESD contact 327-1 on one side (the cathode side) of the first type Gate-Source ESD clamp diode 324 is connected to a gate metal pad 329 and the trenched ESD contact 327-2 on another side (the anode side) of the first type Gate-Source ESD clamp diode 324 is connected to the source metal pad 322. A second type Gate-Source ESD clamp diode (ESD2, as illustrated in FIG. 3A) 330 for providing an ESD protection comprises multiple back to back Zener diodes with alternating n+ doped regions 331 next to p+ doped regions 332, wherein the n+ doped region 331 on one side of the second type Gate-Source ESD clamp diode 330 and the n+ doped region 325 on one side of the first type Gate-Source ESD clamp diode 324 share a common region. The second type Gate-Source ESD clamp diode 330 further comprises trenched ESD contacts (333-1 and 333-2) filled with the contact metal plugs (334-1 and 334-2, which are the same as the contact metal plug 320) extending into the n+ regions 331 on two sides (an anode side and a cathode side) of the second type Gate-Source ESD clamp diode 330. The trenched ESD contact 333-1 on one side (the cathode side) of the second type Gate-Source ESD clamp diode 330 is connected to the gate metal pad 329 and the trenched ESD contact 333-2 on another side (the anode side) of the second type Gate-Source ESD clamp diode 330 is connected to a source metal runner 335. A fourth type Gate-Source ESD clamp diode (ESD4, as illustrated in FIG. 3A) 336 for providing an ESD protection comprises multiple back to back Zener diodes with alternating n+ doped regions 337 next to p+ doped regions 338, wherein the n+ doped region 337 on one side of the fourth type Gate-Source ESD clamp diode 336 and the n+ doped region 331 on one side of the second type Gate-Source ESD clamp diode 330 share a common region. The fourth type Gate-Source ESD clamp diode 336 further comprises trenched ESD contacts (339-1 and 339-2) filled with the contact metal plugs (340-1 and 340-2, which are the same as the contact metal plug 320) extending into the n+ regions 337 on two sides (an anode side and a cathode side) of the fourth type Gate-Source ESD clamp diode 336. The trenched ESD contact 339-1 on one side (the cathode side) of the fourth type Gate-Source ESD clamp diode 336 is connected to a gate metal runner 341 and the trenched ESD contact 339-2 on another side (the anode side) of the fourth type Gate-Source ESD clamp diode 336 is connected to the source metal runner 335. The trench MOSFET 310 further comprises a second type trenched gate functioning as an etch-buffer trenched gate 342 in the N epitaxial layer 311 and right below each of the trenched ESD contacts (319, 327-1, 327-2, 333-1, 333-2, 339-1, and 339-2), wherein the etch-buffer trenched gate 342 has a same structure as the first type trenched gates 314. The etch-buffer trenched gate 342 serves as a buffer layer for prevention of gate-body shortage. The P body regions 315 are formed fully underneath the Gate-Source ESD clamp diodes (324, 330 and 336), therefore, the early breakdown occurrence at corners of the body regions in the prior art would not exist according to the present invention.

Figure 3D:
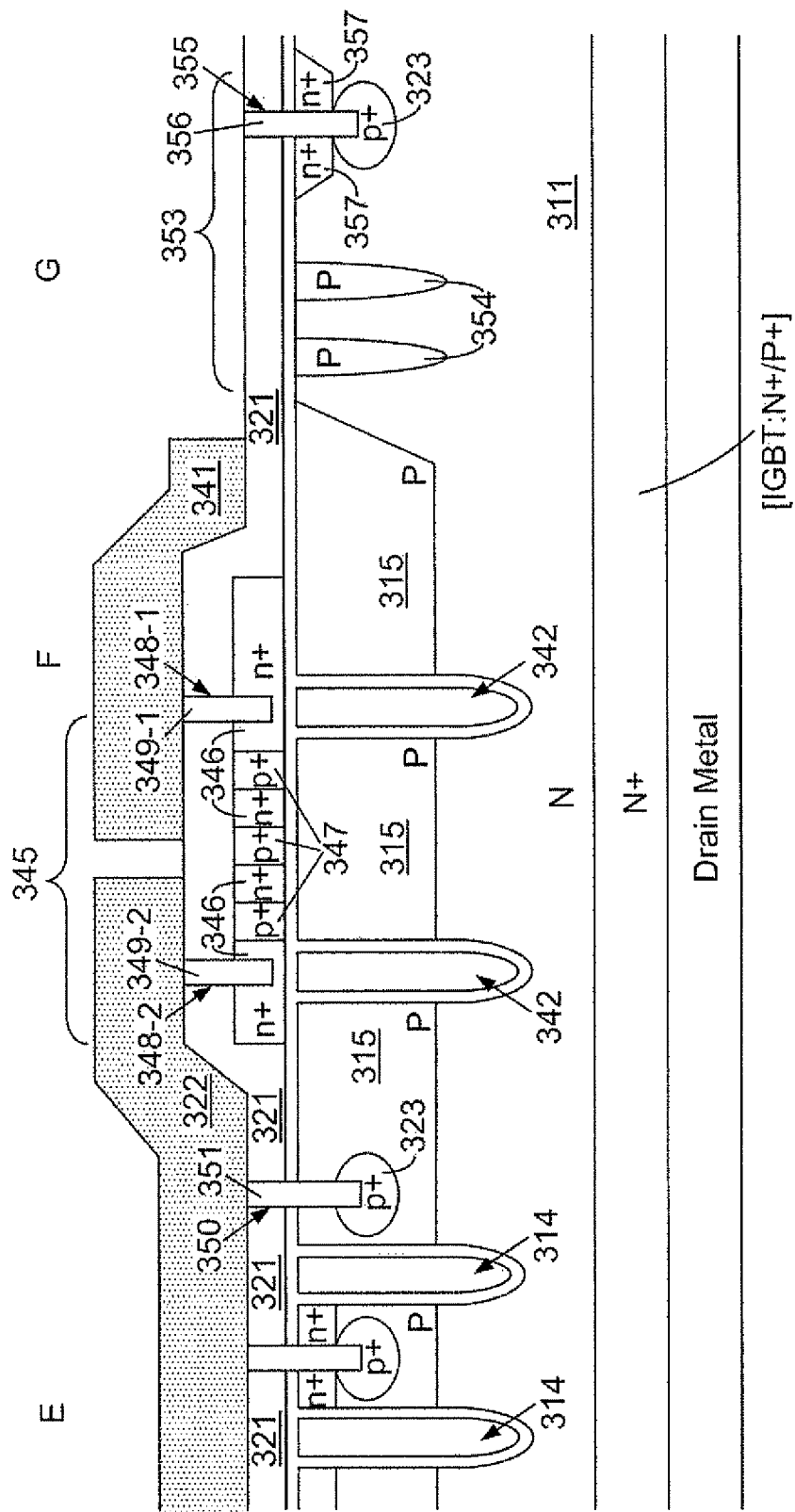
FIG. 3D is a cross-section view showing a preferred E-F-G cross section of FIG. 3A.

Please refer to FIG. 3D for an E-F-G cross-section view of FIG. 3A, which shows a third type Gate-Source ESD clamp diode (ESD3, as illustrated in FIG. 3A) 345 for providing an ESD protection comprises multiple back to back Zener diodes with alternating n+ doped regions 346 next to p+ doped regions 347, and further comprises trenched ESD contacts (348-1 and 348-2) filled with the contact metal plugs (349-1 and 349-2, which are the same as the contact metal plug 320 in FIG. 3C) extending into the n+ regions 346 on two sides (an anode side and a cathode side) of the third type Gate-Source ESD clamp diode 345. The trenched ESD contact 348-1 on one side (the cathode side) of the third type Gate-Source ESD clamp diode 345 is connected to the gate metal runner 341 and the trenched ESD contact 348-2 on another side (the anode side) of the third type Gate-Source ESD clamp diode 345 is connected to the source metal pad 322. Like FIG. 3C, right below each of the trenched ESD contacts (348-1 and 348-2) there is the etch-buffer trenched gate 342 which serves as the buffer layer for prevention of gate-body shortage. A trenched body contact 350 filled with the contact metal plug 351 (the same as the contact metal plug 320 in FIG. 3C) is implemented through the contact interlayer 321 and extending into the P body regions 315 between the first type trenched gate 314 and the etch-buffer trenched gate 342 to connect the P body regions 315 to the source metal pad 322 onto the contact interlayer 321. There is also a p+ ohmic contact doped region 323 surrounding at least bottom of the trenched body contact 350 to reduce the contact resistance between the P body regions 315 and the contact metal plug 351. A termination area 353 comprises a plurality of P body-dopant regions 354 in the N epitaxial layer 311 and a trenched drain contact 355 filled with the contact metal plug 356 (the same as the contact metal plug 320 in FIG. 3C) penetrating through the contact interlayer 321, an n+ source-dopant region 357 and extending into the N epitaxial layer 311 with the p+ ohmic contact doped region 323 surrounding at least its bottom, wherein the n+ source-dopant region 357 can reduce the contact resistance between the N epitaxial layer 311 and the contact metal plug 356 filled in the trenched drain contact 355, wherein the trenched drain contact 355 is finally connected to a drain region in the N epitaxial layer 311.

Figure 3E:
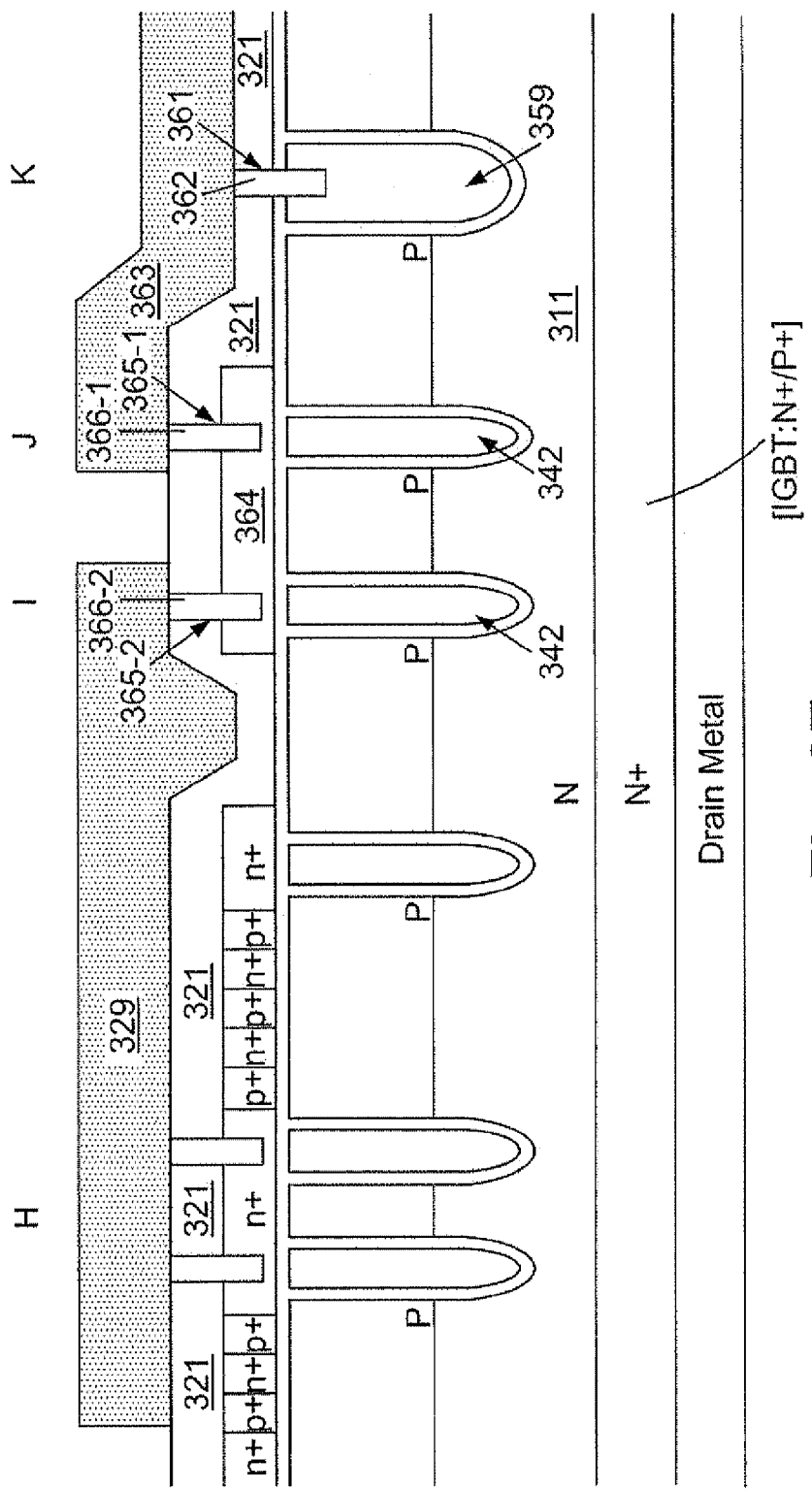
FIG. 3E is a cross-section view showing a preferred H-I-J-K cross section of FIG. 3A.

Please refer to FIG. 3E for an H-I-J-K cross-section view of FIG. 3A, which shows a fourth type trenched gate 359 for gate connection formed in the N epitaxial layer 311 and having a greater trench width than the first type trenched gates 314 shown in FIG. 3C. A trenched gate contact 361 filled with the contact metal plug 362 (the same as the contact metal plug 320 in FIG. 3C), is implemented through the contact interlayer 321 and extending into the fourth type trenched gate 359 for gate connection to connect the trenched gate 359 to a gate contact metal 363 for gate connection. A poly-silicon resistor 364 formed on a top surface of the N epitaxial layer 311 comprises trenched metal contacts (365-1 and 365-2) filled with the contact metal plugs (366-1 and 366-2, which are the same as the contact metal plug 320 in FIG. 3C) and extending into the poly-silicon resistor 364. The trenched metal contact 365-1 on one side of the resistor 364 is connected to the gate contact metal 363 and the trenched metal contact 365-2 on another side of the resistor 364 is connected to the gate metal pad 329. The etch-buffer trenched gate 342 is also formed underneath each of the trenched metal contacts (365-1 and 365-2) to serve as the buffer layer for prevention of gate-body shortage.

Figure 3F:
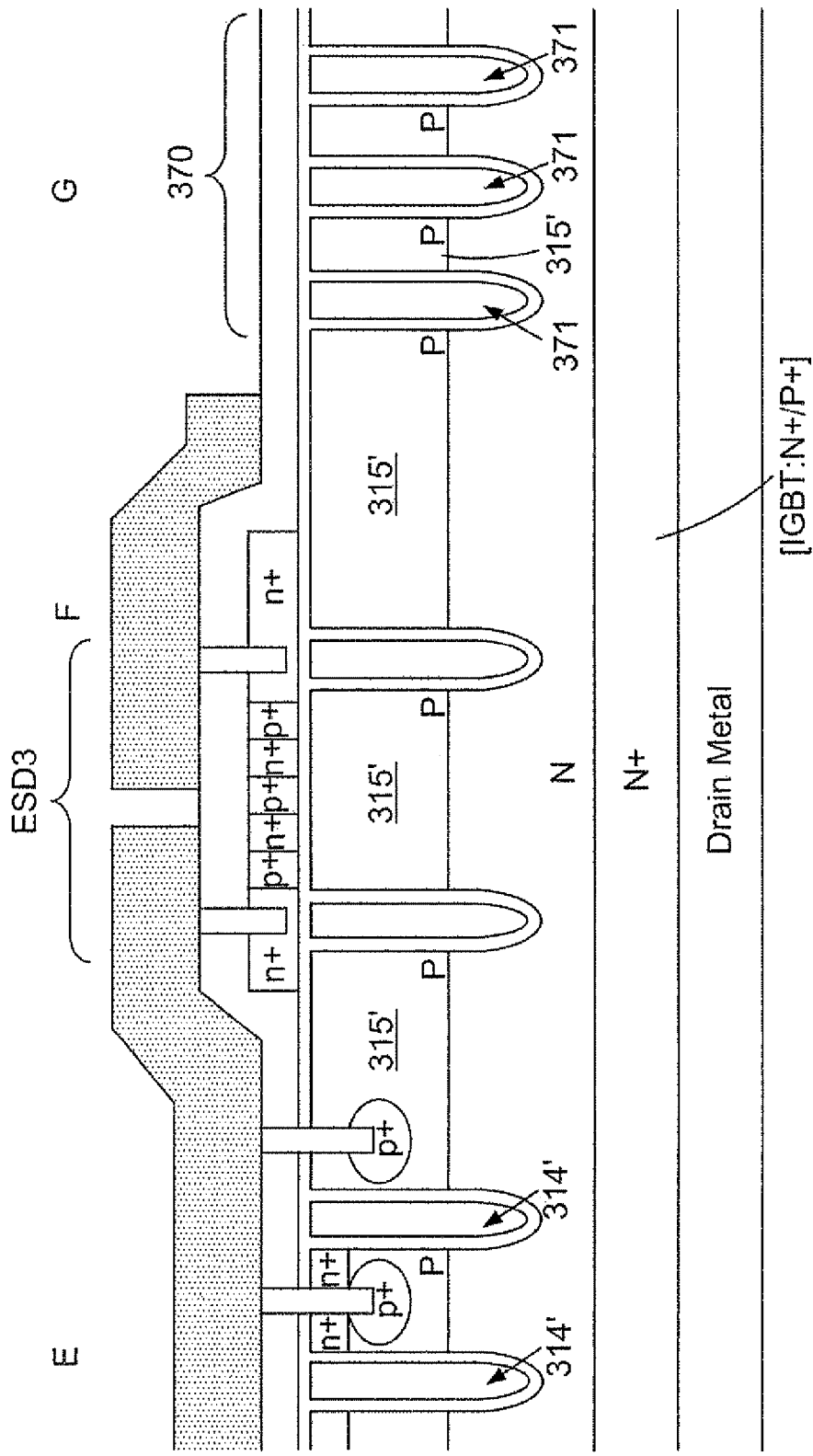
FIG. 3F is a cross-section view showing another preferred E-F-G cross section of FIG. 3A.

Please refer to FIG. 3F for another preferred E-F-G cross-section view of FIG. 3A, wherein the structure of FIG. 3F is similar to the structure of FIG. 3D except the termination area. In FIG. 3F, the termination area 370 comprises multiple third type trenched gates 371 being spaced apart by the P body regions 315', wherein the multiple third type trenched gates 371 having a same structure as the first type trenched gates 314' have floating voltage to function as trenched floating rings for the termination area 370.

As an alternative to the exemplary embodiment illustrated and described above, the semiconductor power device can also be formed as a trench IGBT. In the case of a trench IGBT, the heavily doped N+ substrate should be replaced by an N+ buffer layer extending over a heavily doped P+ substrate. In this regards, the terminology, such as "source", "body", "drain" should be accordingly replaced by "emitter", "base", "collector".

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A semiconductor power device integrated with Gate-Source Electrostatic Discharge (ESD) clamp diodes formed on a semiconductor silicon layer, comprising a plurality of transistor cells in an active area, and multiple back to back Zener diodes with alternating doped regions of a first conductivity type next to a second conductivity type in said Gate-Source ESD clamp diodes, wherein:

said semiconductor power device further comprises:
a plurality of first type trenched gates surrounded by source regions of said first conductivity type encompassed in body regions of said second conductivity type;
a plurality of trenched source-body contacts opened through said source regions and extending into said body regions, filled with a contact metal plug therein and connected to a front metal serving as a source metal pad;
said Gate-Source ESD clamp diodes further comprises:
a gate metal pad connected to at least one gate metal runner surrounding a peripheral region of said semiconductor power device;
said source metal pad connected to at least one source metal runner disposed between said gate metal pad and said gate metal runner, and separated from said gate metal pad and said gate metal runner by a metal gap, wherein said source metal runner does not have said first type trenched gates underneath;
a first type Gate-Source ESD clamp diode connected between said gate metal pad and said source metal pad;
a second type Gate-Source ESD clamp diode connected between said gate metal pad and said source metal runner;
a third type Gate-Source ESD clamp diode connected between said source metal pad and said gate metal runner; and
a fourth type Gate-Source ESD clamp diode connected between said source metal runner and said gate metal runner.

2. The semiconductor power device of claim 1, wherein said gate metal pad has a square, rectangular or circular shape.

3. The semiconductor power device of claim 1, wherein each of said alternating doped regions of said Gate-Source ESD clamp diodes has a closed ring structure.

4. The semiconductor power device of claim 1 further comprising:
a gate contact metal which is connected to said gate metal pad through a poly-silicon resistor, wherein said gate contact metal is also connected to a fourth type trenched gate underneath for gate connection;
said Gate-Source ESD clamp diodes are separately connected to said gate metal pad, said gate metal runner, said source metal pad and said source metal runner via trenched ESD contacts filled with said contact metal plug.

5. The semiconductor power device of claim 1, wherein said body regions are formed underneath said Gate-Source ESD clamp diodes, and are further extended between every two adjacent of second type trenched gates functioning as etch-buffer trenched gates, and said etch-buffer trenched gates are penetrating through said body regions and disposed right below trenched ESD contacts in said Gate-Source ESD clamp diodes, wherein said etch-buffer trenched gates have trench width greater than said trenched ESD contacts for prevention of gate-body shortage.

6. The semiconductor power device of claim 1, wherein said semiconductor silicon layer comprises a first epitaxial layer of said first conductivity type on a substrate of said second conductivity type, and a second epitaxial layer of said first conductivity type on said first epitaxial layer, wherein said first epitaxial layer has a higher doping concentration than said second epitaxial layer.

7. The semiconductor power device of claim 1, wherein said semiconductor silicon layer comprises an epitaxial layer of said first conductivity type extending over a substrate of said first conductivity type.

8. The semiconductor power device of claim 1 further comprising:
at least one body-dopant region of said second conductivity type with floating voltage in a termination area, wherein said body-dopant region is formed simultaneously as said body regions;
a source-dopant region of said first conductivity type formed near an edge of said semiconductor power device, wherein said source-dopant region is formed simultaneously as said source regions;
a trenched drain contact filled with said contact metal plug and penetrating through said source-dopant region, and further extended into said semiconductor silicon layer;
an ohmic contact doped region of said second conductivity type surrounding at least bottom of said trenched drain contact underneath said source-dopant region; and
said ohmic contact doped region has a higher doping concentration than said body regions.

9. The semiconductor power device of claim 8, wherein there is no front metal covering a top surface of said contact metal plug in said trenched drain contact.

10. The semiconductor power device of claim 1 further comprising multiple third type trenched gates having floating voltage in a termination area.

11. The trench semiconductor power device of claim 1, wherein said contact metal plug is a tungsten layer padded with a barrier metal layer of Ti/TiN or Co/TiN.

12. The trench semiconductor power device of claim 1, wherein said front metal is Al alloys overlying a resistance-reduction layer of Ti or Ti/TiN.

* * * * *